US006107001A

United States Patent [19]

Lewis et al.

[11] Patent Number: 6,107,001
[45] Date of Patent: Aug. 22, 2000

[54] METHOD AND APPARATUS FOR NON-ABLATIVE, HEAT-ACTIVATED LITHOGRAPHIC IMAGING

[75] Inventors: Thomas E. Lewis, E. Hampstead, N.H.; Steven J. Frank, Framingham, Mass.

[73] Assignee: Presstek, Inc., Hudson, N.H.

[21] Appl. No.: 08/851,205

[22] Filed: May 5, 1997

[51] Int. Cl.[7] ................................ G03F 7/00; B41N 1/08

[52] U.S. Cl. .......................... 430/302; 430/303; 101/454; 101/456; 101/457; 101/467

[58] Field of Search .................................... 430/302, 303; 101/454, 456, 457, 467

[56] References Cited

U.S. PATENT DOCUMENTS

| | | | |
|---|---|---|---|
| 5,256,506 | 10/1993 | Ellis et al. | 430/20 |
| 5,278,023 | 1/1994 | Bills et al. | 430/201 |
| 5,339,737 | 8/1994 | Lewis et al. | 101/454 |
| 5,351,617 | 10/1994 | Williams et al. | 430/302 X |
| 5,354,633 | 10/1994 | Lewis et al. | 430/5 |
| 5,378,580 | 1/1995 | Leenders | 430/303 |
| 5,478,695 | 12/1995 | Leenders et al. | 430/259 |
| 5,487,338 | 1/1996 | Lewis et al. | 101/454 |
| 5,517,359 | 5/1996 | Gelbart | 359/623 |
| 5,570,636 | 11/1996 | Lewis | 101/454 |
| 5,608,429 | 3/1997 | Hayashihara et al. | 346/135.1 |
| 5,783,364 | 7/1998 | Ellis et al. | 430/302 |

FOREIGN PATENT DOCUMENTS

| | | | |
|---|---|---|---|
| 0 030 642 | 6/1991 | European Pat. Off. | B41C 1/10 |
| 0 580 393 A2 | 7/1992 | European Pat. Off. | B41N 1/14 |
| WO98/31551 | 7/1998 | European Pat. Off. | B41N 3/08 |

OTHER PUBLICATIONS

"Aluminum and Aluminun Alloys", J.R. Davis, ed., (*ASM International 1993*) p. 462–473.

Dan Gelbart, "High Power Multi–Channel Writing Heads", *IS&T's Tenth International Congress on Advances in Non–Impact Printing Technologies,* 337–339 (1994).

*Primary Examiner*—Mark Chapman
*Attorney, Agent, or Firm*—Cesari and McKenna, LLP

[57] ABSTRACT

Methods and apparatus for lithographic imaging without ablation function by irreversibly debonding intermediate printing-plate layers, thereby rendering at least the surface layer removable by cleaning to expose, in an imagewise pattern, an underlying layer having a different affinity for ink and/or an abhesive fluid for ink. In contrast to ablation-type systems, it is unnecessary to destroy a plate layer, thereby reducing power requirements and facilitating increased imaging speeds.

35 Claims, 3 Drawing Sheets

METHOD AND APPARATUS FOR NON-ABLATIVE, HEAT-ACTIVATED LITHOGRAPHIC IMAGING

BACKGROUND OF THE INVENTION

1. Field of the Invention

The present invention relates to digital printing apparatus and methods, and more particularly to a system for imaging lithographic printing plates on- or off-press using digitally controlled laser output.

2. Description of the Related Art

In offset lithography, an image to be transferred to a recording medium is represented on a plate, mat or other printing member as a pattern of ink-accepting (oleophilic) and ink-repellent (oleophobic) surface areas. In a dry printing system, the member is simply inked and the image transferred onto a recording material; the member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

In a wet lithographic system, the non-image areas are hydrophilic in the sense of affinity for dampening (or "fountain") solution, and the necessary ink-repellency is provided by an initial application of such a solution to the plate prior to inking. The ink-abhesive fountain solution prevents ink from adhering to the non-image areas, but does not affect the oleophilic character of the image areas.

If a press is to print in more than one color, a separate printing plate corresponding to each color is required. The plates are each mounted to a separate plate cylinder of the press, and the positions of the cylinders coordinated so that the color components printed by the different cylinders will be in register on the printed copies. Each set of cylinders associated with a particular color on a press is usually referred to as a printing station.

Because of the ready availability of laser equipment and their amenability to digital control, significant effort has been devoted to the development of laser-based imaging systems. Early examples utilized lasers to etch away material from a plate blank to form an intaglio or letterpress pattern. See, e.g., U.S. Pat. Nos. 3,506,779 and 4,347,785. This approach was later extended to production of lithographic plates, for example, by removal of a hydrophilic surface to reveal an oleophilic underlayer. See, e.g., U.S. Pat. No. 4,054,094. These systems generally require high-power lasers, which are expensive and slow.

A second approach to laser imaging involves the use of thermal-transfer materials. See, e.g., U.S. Pat. Nos. 3,945,318; 3,962,513; 3,964,389; 4,395,946, 5,156,938; and 5,171,650, as well as copending application Ser. No. 08/376,766. With these systems, a polymer sheet transparent to the radiation emitted by the laser is coated with a transferable material. During operation the transfer side of i this construction is brought into contact with an acceptor sheet, and the transfer material is selectively irradiated through the transparent layer. Irradiation causes the transfer material to adhere preferentially to the acceptor sheet. The transfer and acceptor materials exhibit different affinities for fountain solution and/or ink, so that removal of the transparent layer together with unirradiated transfer material leaves a suitably imaged, finished plate. Typically, the transfer material is oleophilic and the acceptor material hydrophilic. This technique generally requires maintenance of a highly clean environment to avoid image degradation.

Lasers can also be used to expose a photosensitive blank for traditional chemical processing. See, e.g., U.S. Pat. Nos. 3,506,779; 4,020,762. Similalry, lasers have been employed to selectively remove, in an imagewise pattern, an opaque coating that overlies a photosensitive plate blank. The plate is then exposed to a source of radiation, with the unremoved material acting as a mask that prevents radiation from reaching underlying portions of the plate. See, e.g., U.S. Pat. No. 4,132,168. Either of these imaging techniques requires the cumbersome chemical processing associated with traditional, non-digital platemaking.

More recently, lithographic printing plates have been designed for low-power ablation imaging mechanisms. U.S. Pat. Nos. 5,339,737 and 5,379,698 (the entire disclosures of which are hereby incorporated by reference) disclose a variety of ablation-type lithographic plate configurations for use with imaging apparatus that utilize diode lasers. For example, laser-imageable lithographic printing constructions in accordance with these patents may include a first, topmost layer chosen for its affinity for (or repulsion of) ink or an ink-abhesive fluid; an ablation layer, which volatilizes into gaseous and particulate debris in response to imaging (e.g., infrared, or "IR") radiation, thereunder; and beneath the imaging layer, a strong, durable substrate characterized by an affinity for (or repulsion of) ink or an ink-abhesive fluid opposite to that of the first layer. Ablation of the imaging layer weakens the topmost layer as well. By disrupting its anchorage to an underlying layer, the topmost layer is rendered easily removable in a post-imaging cleaning step, creating an image spot having an affinity for ink or an ink-abhesive fluid differing from that of the unexposed first layer.

Although this type of construction facilitates much faster imaging and at power levels significantly lower than those of older "etching" laser systems, the laser pulse must still transfer sufficient energy to cause the ablation layer to catastrophically overheat and change phase. Accordingly, even low-power lasers must be capable of very rapid rise times, and imaging speeds—that is, the laser pulse rate—must not be so fast as to preclude the requisite energy buildup during each imaging pulse.

Microscopic observation of behavior during imaging of these three-layer constructions reveals that the initial response to a laser pulse is formation of a gas pocket between the surface layer and the underlying layer, which persists well after the pulse has terminated. This pocket is believed to be formed primarily by gas resulting from thermal decomposition of the surface layer immediately in contact with the underlying layer.

For example, investigations of dry plates in accordance with the '698 patent (comprising a polyester substrate, a titanium layer approximately 30 nm thick, and a silicone surface layer) suggest that the silicone layer debonds from the underlying titanium layer at laser fluences far short of that necessary for ablation of the titanium. This observation is important to understanding of the ablation mechanism. The polymeric layers above and below the titanium layer have substantially greater heat capacities than the very thin titanium, with the result that they act as heat sinks, dissipating laser energy absorbed by the titanium layer and thereby increasing the fluence necessary for ablation. With the titanium layer detached from the overlying silicone layer, however, heat dissipation is essentially halved, forcing the titanium layer to retain more of the laser energy. This observation validates the general preference for short, intense laser pulses, since these minimize heat transport (which is time-dependent) and also the fluence necessary to achieve ablation.

Unfortunately, this mechanism suggests the continued need for complete ablation of the titanium layer, with the consequent constraints on laser power and imaging speed. Unless the layer underlying the silicone is ablated, the silicone will reattach to that layer once the gas pocket has dissipated, and therefore will not be removed by mechanical cleaning processes.

DESCRIPTION OF THE INVENTION

Brief Summary of the Invention

It has been discovered that under certain circumstances, ablation of an underlying layer is not necessary to debond the surface layer in order to facilitate its removal. So long as the surface layer is chosen or modified to resist reattachment to the underlying layer, it will be capable of removal by mechanical cleaning or using a non-solvent for the surface layer, and the plate can therefore be imaged without ablation.

A variety of plate structures are amenable to imaging in accordance with the invention. For example, in a first embodiment, the plate includes a first layer, a second layer disposed beneath and attached to the first layer and a third layer disposed beneath the second layer, the first and second layers having different affinities for ink and/or an abhesive fluid for ink. In a first version of this embodiment, the first layer is oleophobic and the second layer is oleophilic. In a second version of this embodiment, the first layer is hydrophilic and the second layer is oleophilic and hydrophobic. In a third version, the first layer is oleophilic and the second layer is hydrophilic.

The second layer may be inorganic (e.g., a metal) or organic (e.g., a polymer coating). The function of this layer is to absorb sufficient imaging radiation to cause thermally activated detachment from the overlying first layer, and to exhibit the proper printing affinity. The second layer should also exhibit good adhesion to the first and third layers, so that it is not inadvertently removed by the cleaning process.

Accordingly, an example of the just-described first version includes a silicone or fluoropolymer coating overlying a layer of metal (e.g., titanium), which itself overlies a polyester film. An example of the second version utilizes a polyvinyl alcohol or inorganic first layer above a polymeric layer impregnated with a compound that absorbs imaging radiation. To achieve the third version, an oleophilic polymeric first layer overlies a layer of, for example, metal such as titanium, aluminum, vanadium or zirconium, or a metallic inorganic layer (see copending application Ser. No. 08/700, 287, now U.S. Pat. No. 5,783,364 entitled THIN-FILM IMAGING RECORDING CONSTRUCTIONS INCORPORATING METALLIC INORGANIC LAYERS AND OPTICAL INTERFERENCE STRUCTURES, filed on Aug. 20, 1996, the entire disclosure of which is hereby incorporated by reference), all of which accept fountain solution. Any of the foregoing second layers will exhibit substantial adhesion to an overlying polymeric layer.

In accordance with the invention, the printing member is heated so as to detach, in an imagewise pattern, the first layer from the second layer without ablating the second layer. Following imaging, the first layer is removed where detached from the second layer so as to form a lithographic image. Consequently, the first layer is chosen or modified to resist reattachment to the second layer following separation. In order to ensure this, the first layer may be a polymer formulated to undergo thermal fracture, permanently degrading in a manner that reduces its ability to bond to the second layer; the resulting disruption of molecular structure usually also renders the material more easily removed by cleaning.

In an alternative approach using this embodiment, the first and third layers exhibit different affinities for ink and/or an abhesive fluid for ink, and the second layer, where exposed to imaging radiation, is removed along with the first during cleaning.

In a variation to this embodiment, the plate construction can be designed to accommodate surface layers that do not exhibit (or cannot be modified to exhibit) adequate resistance to reattachment. This is accomplished by interposing intermediate layer between the surface layer (which exhibits the desired printing affinity) and the second layer. This intermediate layer exhibits good adhesion to the first and second layers, but is formulated to lose adhesion to at least the second layer and to generate gas upon exposure to heat. As a result, the first and intermediate layers are removed, where imaged, during the cleaning process.

In a second embodiment, the plate is based on a two-layer design including a first layer and a second layer attached thereto, the first and second layers having different affinities ink and/or an abhesive fluid for ink. When heated, the first layer is detached from the second layer without substantially ablating the second layer. The detached portions of the first layer are removed from the second layer so as to form a lithographic image. Preferably, the detachment is accomplished without significant phase change or ablation of the second layer. However, because this layer can be thick, minor amounts of heat-induced damage will not affect its printing function.

In one version of this embodiment, the first layer is oleophobic (based on, e.g., a silicone or fluoropolymer), and the second layer is oleophilic. In a second version of this embodiment, the first layer is hydrophilic and the second layer is oleophilic and hydrophobic. In either case, the second layer may be based on an oleophilic polymeric material. Preferably, the polymer contains a radiation absorber so that application of imaging radiation causes thermal buildup in this layer. For example, the second layer may be a polycarbonate, polyester or polyamide film with, e.g., a near-IR absorber (such as carbon black) dispersed therein. Alternatively, the second layer may be a metal treated to trap imaging radiation.

The imaging device used to imagewise heat the plate constructions in accordance with the invention is not critical. Diode lasers, such as those disclosed in connection with the '737 and '698 patents, are suitable, but other techniques can be used as well. For example, light valving (see, e.g., U.S. Pat. No. 5,517,359, the entire disclosure of which is hereby incorporated by reference), multibeam imaging arrangements, and exposure through a mask can all be applied to the present invention.

As used herein, the term "plate" refers to any type of printing member or surface capable of recording an image defined by regions exhibiting differential affinities for ink and/or fountain solution; suitable configurations include the traditional planar or curved lithographic plates that are mounted on the plate cylinder of a printing press, but can also include seamless cylinders (e.g., the roll surface of a plate cylinder), an endless belt, or other arrangement.

BRIEF DESCRIPTION OF THE DRAWINGS

The foregoing discussion will be understood more readily from the following detailed description of the invention, when taken in conjunction with the accompanying drawings, in which.

The drawings and components shown therein are not necessarily to scale.

DETAILED DESCRIPTION OF THE PREFERRED EMBODIMENTS

Figure 1:
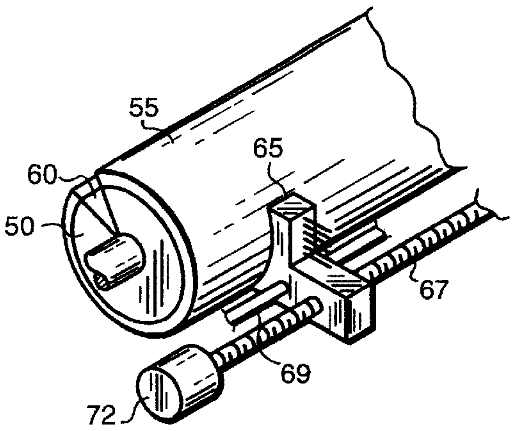
FIG. 1 is an isometric view of the cylindrical embodiment of an imaging apparatus in accordance with the present invention, and which operates in conjunction with a diagonal-array writing array.
Figure 2:
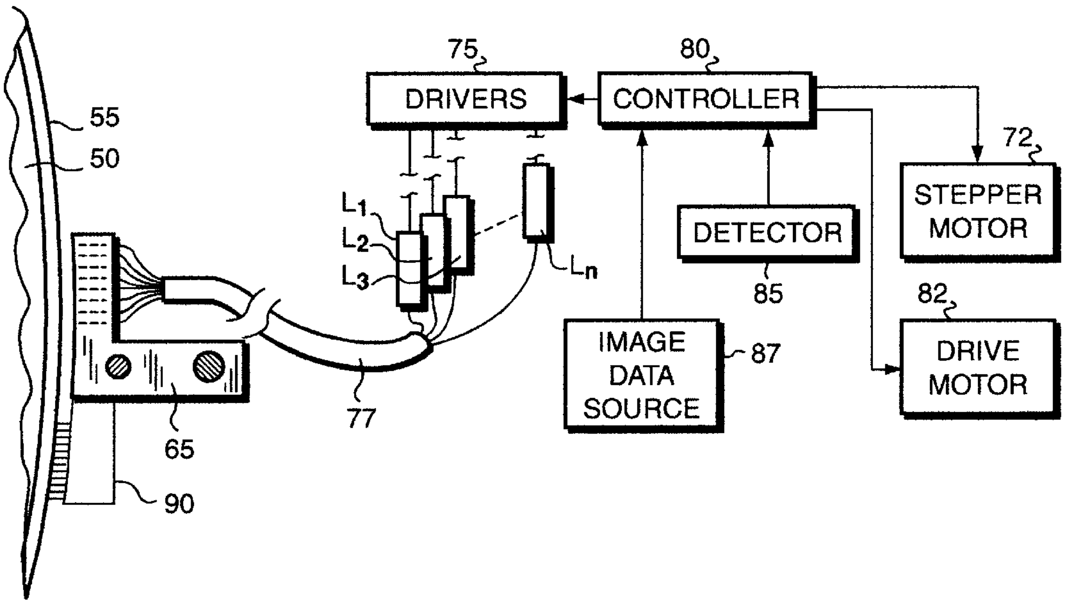
FIG. 2 is a schematic depiction of the embodiment shown in FIG. 1, and which illustrates in greater detail its mechanism of operation.

As noted previously, the type of imaging apparatus used to practice the present invention is not critical. A representative system is shown in FIGS. 1 and 2. The illustrated assembly includes a cylinder 50 around which is wrapped a lithographic plate blank 55; in accordance with the invention, cylinder 50 may be the plate cylinder of a printing press, or may instead be part of a stand-alone platesetter.

Cylinder 50 includes a void segment 60, within which the outside margins of plate 55 are secured by conventional clamping means (not shown). The size of the void segment can vary greatly depending on the environment in which cylinder 50 is employed.

If desired, cylinder 50 is straightforwardly incorporated into the design of a conventional lithographic press, and serves as the plate cylinder of the press. In a typical press construction, plate 55 receives ink from an ink train, whose terminal cylinder is in rolling engagement with cylinder 50. The latter cylinder also rotates in contact with a blanket cylinder, which transfers ink to the recording medium. The press may have more than one such printing assembly arranged in a linear array. Alternatively, a plurality of assemblies may be arranged about a large central impression cylinder in rolling engagement with all of the blanket cylinders.

The recording medium is mounted to the surface of the impression cylinder, and passes through the nip between that cylinder and each of the blanket cylinders. Suitable central-impression and in-line press configurations are described in U.S. Pat. Nos. 5,163,368 and 4,911,075 (the entire disclosures of which are hereby incorporated by reference).

Cylinder 50 is supported in a frame and rotated by a standard electric motor or other conventional means (illustrated schematically in FIG. 2). The angular position of cylinder 50 is monitored by a shaft encoder. A writing array 65, mounted for movement on a lead screw 67 and a guide bar 69, traverses plate 55 as it rotates. Axial movement of writing array 65 results from rotation of a stepper motor 72, which turns lead screw 67 and thereby shifts the axial position of writing array 55. Stepper motor 72 is activated during the time writing array 65 is positioned over void 60, after writing array 65 has passed over the entire surface of plate 55. The rotation of stepper motor 72 shifts writing array 65 to the appropriate axial location to begin the next imaging pass.

The axial index distance between successive imaging passes is determined by the number of imaging elements in writing array 65 and their configuration therein, as well as by the desired resolution. As shown in FIG. 2, a series of laser sources $L_1$, $L_2$, $L_3$. . . $L_n$, driven by suitable laser drivers collectively designated by reference numeral 75, each provide output to a fiber-optic cable. The lasers are preferably gallium-arsenide or other diode models, although any high-speed lasers that emit in the near infrared region can be utilized advantageously.

The final plates should be capable of delivering at least 1,000, and preferably at least 50,000 printing impressions. This requires fabrication from durable material, and imposes certain minimum power requirements on the laser sources. Because the present invention avoids the need to ablate one or more plate layers, power levels can be relatively low and imaging speeds quite high; of course, because of the need to transfer a minimum quantity of energy to achieve the requisite heating effect, there remains a tradeoff between power and achievable speed. This is discussed in greater detail below.

The cables that carry laser output are collected into a bundle 77 and emerge separately into writing array 65. It may prove desirable, in order to conserve power, to maintain the bundle in a configuration that does not require bending above the fiber's critical angle of refraction (thereby maintaining total internal reflection); however, we have not found this necessary for good performance.

Also as shown in FIG. 2, a controller 80 actuates laser drivers 75 when the associated lasers reach appropriate points opposite plate 55, and in addition operates stepper motor 72 and the cylinder drive motor 82. Laser drivers 75 should be capable of operating at high speed to facilitate imaging at commercially practical rates. The drivers preferably include a pulse circuit capable of generating at least 40,000 laser-driving pulses/second, with each pulse being relatively short, e.g., on the order of 1–5 psec.

Controller 80 receives data from two sources. The angular position of cylinder 50 with respect to writing array 65 is constantly monitored by a detector 85, which provides signals indicative of that position to controller 80. In addition, an image data source (e.g., a computer) also provides data signals to controller 80. The image data define points on plate 55 where image spots are to be written. Controller 80, therefore, correlates the instantaneous relative positions of writing array 65 and plate 55 (as reported by detector 85) with the image data to actuate the appropriate laser drivers at the appropriate times during scan of plate 55. The control circuitry required to implement this scheme is well-known in the scanner and plotter art; a suitable design is described in U.S. Pat. No. 5,174,205, the entire disclosure of which is hereby incorporated by reference.

The laser output cables terminate in lens assemblies, mounted within writing array 65, that precisely focus the beams onto the surface of plate 55.

Post-imaging cleaning can be accomplished using a contact cleaning device 90. This may be, for example, a rotating brush or belt, or other suitable means; useful mechanical cleaning devices for on-press applications, which can be employed with or without a cleaning solvent (or non-solvent), are described in U.S. Pat. Nos. 5,148,746 and 5,568,768 and copending application Ser. No. 08/697,680, the entire disclosures of which are hereby incorporated by reference. Cleaning device 90 may be associated with writing array 65 so as to traverse plate 55 therewith, or may instead be a separate assembly in proximity to plate 55, as shown in FIG. 2.

Figure 3:
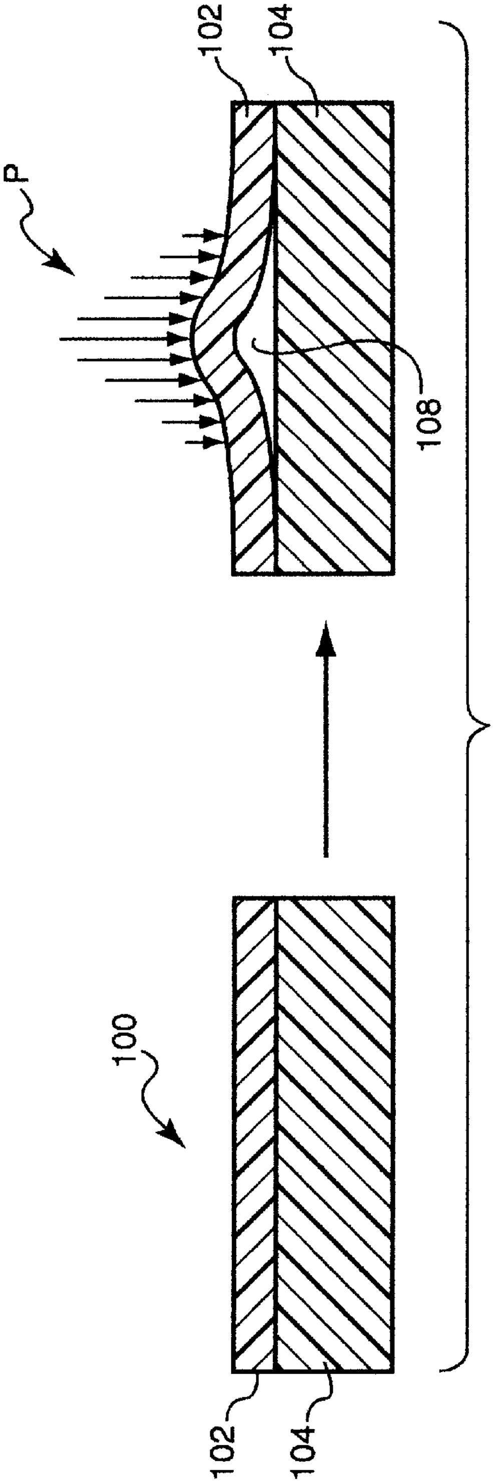
FIGS. 3–6 are enlarged sectional views showing lithographic plates imageable in accordance with the present invention.

Refer now to FIGS. 3–6, which illustrate various plate constructions imageable nonablatively in accordance with the invention. FIG. 3 illustrates a construction 100 comprising a surface layer 102 and a substrate 104. Layers 102 and 104 exhibit opposite affinities for ink and/or an ink-abhesive fluid. In one version of this plate, surface layer 102 is a silicone polymer or fluoropolymer that repels ink, while substrate 104 is an oleophilic polyester or treated metal as described below; the result is a dry plate. In a second, wet-plate version, surface layer 102 is a hydrophilic material such as polyvinyl alcohol, while substrate 104 is both oleophilic and hydrophobic (again, polymer films such as polyester are suitable).

Substrate 104 is preferably strong, stable and flexible, and includes or is fabricated from a material that absorbs imaging radiation. For example, substrate 104 may be a polyester or polycarbonate film containing carbon-black particles or other radiation absorber. Preferred organic materials include heat-stable polymers, e.g., pheny-substituted siloxanes (typically phenylmethyldimethylsiloxane copolymers). For such materials, it may be useful to incorporate an adhesion-promoting comonomer (e.g., aminopropylmethylsiloxane) to form a terpolymer that readily adheres to the adjacent layers. Polyimides also represent a readily available class of heat-stable polymer.

In the case of IR or near-IR imaging radiation, suitable absorbers include a wide range of dyes and pigments, such as phthalocyanines (e.g., aluminum phthalocyanine chloride, titanium oxide phthalocyanine, vanadium (IV) oxide phthalocyanine, and the soluble phthalocyanines supplied by Aldrich Chemical Co., Milwaukee, Wis.); naphthalocyanines (see, e.g., U.S. Pat. Nos. 4,977,068; 4,997,744; 5,023,167; 5,047,312; 5,087,390; 5,064,951; 5,053,323; 4,723,525; 4,622,179; 4,492,750; and 4,622,179); iron chelates (see, e.g., U.S. Pat. Nos. 4,912,083; 4,892,584; and 5,036,040); nickel chelates (see, e.g., U.S. Pat. Nos. 5,024,923; 4,921,317; and 4,913,846); oxoindolizines (see, e.g., U.S. Pat. No. 4,446,223); iminium salts (see, e.g., U.S. Pat. No. 5,108,873); and indophenols (see, e.g., U.S. Pat. No. 4,923,638). Any of these materials may be dispersed in the prepolymer before it is cross-linked into the final film.

Figure 4:
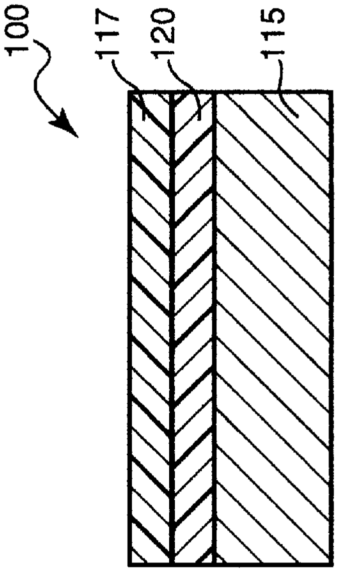

It is also possible to utilize a metal substrate (shown at 115 in FIG. 4). Although metals rapidly conduct heat and therefore ordinarily serve as poor heating layers, it is possible to treat metals to exhibit coloration and act as radiation absorbers. For example, a black, mixed-valence iron oxide can be produced on a ferrous metal. The oxide will absorb IR radiation, and the color can be deepened (and radiation absorption thereby enhanced) through doping with a metal such as manganese.

Alternatively, color can be imparted to an aluminum substrate through anodizing. This process converts the surface of an aluminum substrate to aluminum oxide by employing the substrate as the anode of an electrolytic cell, and can be utilized to apply color in several ways. For example, organic dyes can be absorbed in the pores of the anodic coatings, or mineral pigments can be precipitated within the pores, before the coating is sealed. The depth of dye absorption (and, therefore, the degree of radiation absorption) depends on the thickness and porosity of the anodic coating. In "integral color anodizing," pigmentation is caused during anodizing by the occlusion of microparticles in the coating, which result from the anodic reaction of the electrolyte with the microconstituents and matrix of the aluminum alloy. In the electrolytic coloring process, the aluminum is conventionally anodized in a sulfuric acid electrolyte, after which it is rinsed and transferred to an acidic electrolyte containing a dissolved metal salt. Using alternating current, a metallic pigment is electrodeposited in the pores of the anodic coating. Usually tin, nickel or cobalt is deposited, and the resulting bronze or black colors provide good absorption of, for example, near-IR radiation. See, e.g., *Aluminum and Aluminum Alloys*, J. R. Davis, ed. (ASM International 1993).

For additional strength, particularly where polymeric substrates 104 are employed, it is possible to utilize the approach described in U.S. Pat. No. 5,188,032 (the entire disclosure of which is hereby incorporated by reference). As discussed in that application, a metal sheet can be laminated to substrate 104. Suitable metals, laminating procedures and preferred dimensions and operating conditions are all described in the '032 patent, and can be straightforwardly applied to the present context without undue experimentation.

FIG. 2 illustrates the consequences of exposing the plate 100 to the output of an imaging laser. When an imaging pulse P (having a Gaussian spatial profile as indicated) reaches plate 100, it passes through layer 102 and heats layer 104, causing formation of a gas bubble or pocket 108. Expansion of pocket 108 lifts layer 102 off layer 104 in the region of the imaging pulse. Accordingly, surface layer 102 is substantially transparent to imaging radiation, and is formulated to resist reattachment to layer 104 following dissipation of gas pocket 108.

In one version of the embodiment shown in FIG. 3, layer 102 is chemically formulated to undergo rapid thermal homolysis (pyrolysis) in response to the heat applied to the underside of layer 102 by energy-absorbing layer 104. For example, layer 102 may be (or include as a primary polymer component) a silicone block copolymer having a chemically labile species as one of the blocks. In an exemplary approach, the silicone block copolymer has an ABA structure, where the A blocks are long, functionally (e.g., vinyldimethyl) terminated polysiloxane chains and the B block is an acrylic (e.g., a short polymethylmethacrylate chain). A suitable chemical formula is:

$$CH_2{=}CH{-}(\text{polysiloxane}){-}(\text{acrylic}){-}(\text{polysiloxane}){-}CH{=}CH_2$$

This material is easily thermally degraded, undergoing chemical transformations that discourage re-adhesion to underlying layer 104.

In another version, layer 102 is a hydrophilic polymer such as polyvinyl alcohol (e.g., the Airvol 125 or 165 material supplied by Air Products, Allentown, Pa.).

It may in some cases be desirable to utilize a surface layer that cannot easily be modified to avoid reattachment to an underlying layer. Alternatively, it may be desirable to utilize as a substrate an unmodified metal layer that would fail to heat sufficiently in response to low-power, high-speed imaging pulses. In either case, as shown in FIG. 4, the plate construction 110 includes a substrate 115, a surface layer 117, and an intermediate layer 120 that irreversibly detaches either from layer 115 or layer 117 in response to an imaging pulse. In the former case, post-imaging cleaning removes layers 117 and 120 where plate 110 is struck by imaging pulses, while in the latter case, layer 120 remains and serves as a printing surface. Layer 120 may be, for example, a polymeric material capable of evolving nitrogen gas upon heating; suitable examples are disclosed in U.S. Pat. No. 5,278,023 (the entire disclosure of which is hereby incorporated by reference).

Figure 5:
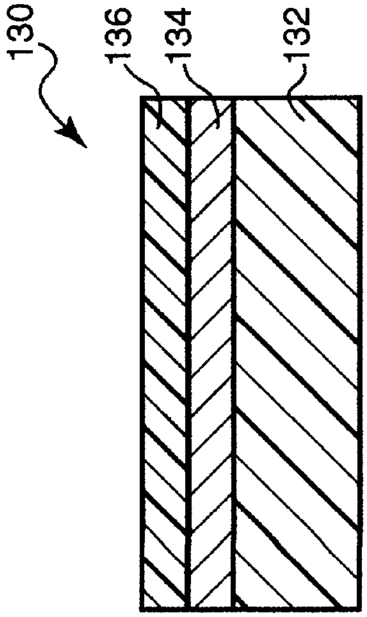

In a second embodiment, the plate is a three-layer construction as shown in FIG. 5. The plate 130 includes includes a substrate 132, a layer 134 capable of absorbing imaging radiation, and a surface coating layer 136. Layer 134 may be polymeric or metal in nature. In the former case, layer 134 can, for example, consist of a polymeric system that intrinsically absorbs in the near-IR region (e.g., a polypyrrole), or a polymeric coating into which near IR-absorbing components have been dispersed or dissolved (e.g., a solvent-cast polyimide or poly(amide-imide) containing an absorbing pigment as described above).

In the latter case, layer 134 can be at least one layer of a metal deposited onto a polyester substrate 132. Once again, brief exposure of this construction to a laser pulse heats the thin metal layer without ablating it, detaching it from the overlying layer 136 and destroying its anchorage. Depending on design, cleaning can either remove this layer in its entirety along with detached portions of overlying layer 136, or can instead leave layer 134 either in whole or in part. Because metals typically retain applied ink (in the case of a dry plate) or fountain solution (in the case of a negative-working wet plate having a hydrophobic, oleophilic surface), it is often unnecessary to achieve complete removal in any case. Nonetheless, layer 134 is preferably thin to minimize heat transport within layer 134 (i.e., transverse to the direction of the imaging pulse), thereby concentrating heat within the region of the imaging pulse so as to effect formation of a gas pocket at minimal imaging power. In a preferred embodiment, layer 134 is titanium applied (e.g., by sputtering or vacuum deposition) at 300±50 Å or less.

Titanium is preferred for layer 134, particularly in conjunction with a silicone layer 136. Titanium layers exhibit substantial resistance to handling damage, particularly when compared with metals such as aluminum, zinc and chromium; this feature is important both to production, where damage to layer 134 can occur prior to coating thereover of layer 136, and in the printing process itself where weak intermediate layers can reduce plate life. In the case of dry lithography, titanium further enhances plate life through resistance to interaction with ink-borne solvents that, over time, migrate through layer 136; other materials, such as organic layers, may exhibit permeability to such solvents and allow plate degradation. Moreover, silicone coatings applied to titanium layers tend to cure at faster rates and at lower temperatures (thereby avoiding thermal damage to substrate 132), require lower catalyst levels (thereby improving pot life) and, in the case of addition-cure silicones, exhibit "post-cure" cross-linking (in marked contrast, for example, to nickel, which can actually inhibit the initial cure). The latter property further enhances plate life, singe more fully cured silicones exhibit superior durability, and also provides further resistance against ink-borne solvent migration. Post-cure cross-linking is also useful where the desire for high-speed coating (or the need to run at reduced temperatures to avoid thermal damage to substrate 132) make full cure on the coating apparatus impracticable. Titanium also provides advantageous environmental and safety characteristics: its ablation does not produce measurable emission of gaseous byproducts, and environmental exposure presents minimal health concerns. Finally, titanium, like many other metals, exhibits some tendency to intoract with oxygen during the deposition process (vacuum evaporation, electron-beam evaporation or sputtering); however, the lower oxides of titanium formed in this manner (particularly TiO) are strong absorbers of near-IR imaging radiation. In contrast, the likely oxides of aluminum, zinc and bismuth are relatively poor absorbers of such radiation.

Despite the advantages of titanium, it is possible to utilize other metals for layer 134. The primary requirements of suitable materials are adhesion to layers 132, 136, and the absence of deleterious interference with layer 136 when applied in a pre-cured state; for example, some metals may poison the catalyst used to cure layer 136. These criteria support the use of metals such as aluminum, vanadium and zirconium.

Alternatively, layer 134 may be a metallic inorganic layer. Such materials are typically hydrophilic, so layer 136 can be oleophilic (e.g., polyester), resulting in an indirectly written plate (whereby imaging pulses define background rather than inked areas). The metallic inorganic material may comprise a compound of at least one metal with at least one non-metal, or a mixture of such compounds. If, as is preferred, this layer is to serve as a printing surface (i.e., persist despite cleaning), it is typically applied at a thickness of several hundred Å or more.

The metal component of a suitable metallic inorganic material may be a d-block (transition) metal, an f-block (lanthanide) metal, aluminum, indium or tin, or a mixture of any of the foregoing (an alloy or, in cases in which a more definite composition exists, an intermetallic). Preferred metals include titanium, zirconium, vanadium, niobium, tantalum, molybdenum and tungsten. The non-metal component may be one or more of the p-block elements boron, carbon, nitrogen, oxygen and silicon. A metal/non-metal compound in accordance herewith may or may not have a definite stoichiometry, and may in some cases (e.g., Al-Si compounds) be an alloy. Preferred metal/non-metal combinations include TiN, TiON, $TiO_x$ (where $0.9 \leqq x \leqq 2.0$), TiAlN, TiAlCN, TiC and TiCN.

Preferred materials for substrate 132 have surfaces to which the deposited metal adheres well, and exhibit substantial flexibility to facilitate spooling and winding over the surface of a plate cylinder. One useful class of preferred polyester material is the unmodified film exemplified by the MELINEX 442 product marketed by ICI Films, Wilmington, Del., and the 3930 film product marketed by Hoechst-Celanese, Greer, S.C. Also advantageous, depending on the metal employed, are polyester materials that have been modified to enhance surface adhesion characteristics as described above. Suitable polyesters of this type include the ICI MELINEX 453 film. These materials accept titanium without the loss of properties. Other metals, by contrast, may require custom pretreatments of the polyester film in order to create compatibility therebetween. For example, vinylidenedichloride-based polymers are frequently used to anchor aluminum onto polyesters.

A preferred film thickness is 0.007 inch, but thinner and thicker versions can be used effectively. For laminated constructions (discussed in greater detail below), a preferred thickness is 0.002 inch.

It may be useful to employ substrates capable of reflecting any unabsorbed imaging radiation back into layer 134. Suitable for this purpose in the context of IR imaging radiation is the white 329 polyester film supplied by ICI Films, Wilmington, Del., which utilizes IR-reflective barium sulfate as the white pigment. Alternatively, in the case of a laminated construction, substrate 132 may be transparent and reflectivity provided by the laminated support or the laminating adhesive (see, e.g., U.S. Pat. No. 5,570,636, the entire disclosure of which is hereby incorporated by reference).

The considerations governing choice of a material for layer 136 are the same as those pertaining to layer 102, described above.

Figure 6:
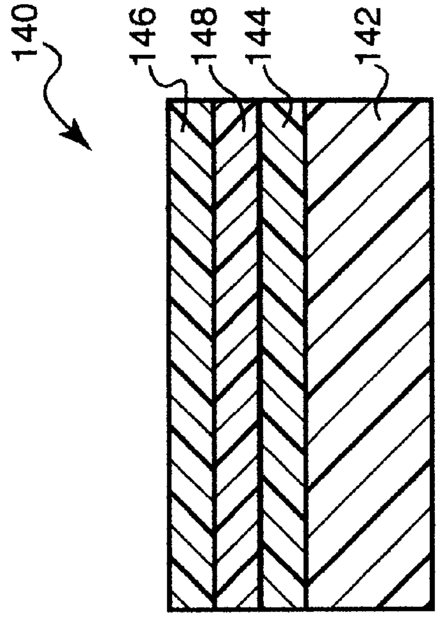

Once again, it is possible to use an intermediate layer to accommodate a desired combination of absorbing and overlying layers that would not undergo irreversible attachment as required by the present invention. This is shown in FIG. 6, which also illustrates use of a polymeric absorbing layer. In particular, the plate 140 includes a substrate 142 and a surface layer 146 as discussed in connection with plate 130 (see FIG. 5); a polymeric absorbing layer 144, as discussed in connection with plate 110 (see FIG. 4); and an intermediate layer, also as discussed in connection with plate 110.

It will therefore be seen that the foregoing approach to nonablative imaging offers substantial advantages in terms of imaging speed and power requirements. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of imaging a lithographic printing member, the method comprising the steps of:

a. providing a printing member including a first layer and a second layer attached thereto, the first and second layers having different affinities for at least one printing liquid selected from the group consisting of ink and an abhesive fluid for ink;

b. heating the printing member so as to irreversibly detach, in an imagewise pattern, the first layer from the second layer without substantially ablating the second layer; and c. removing the first layer where detached from the second layer so as to form a lithographic image.

2. The method of claim 1 wherein the second layer is a metal treated to absorb imaging radiation.

3. The method of claim 2 wherein the metal layer does not undergo phase change as a consequence of heating.

4. The method of claim 2 wherein the metal layer has a surface selected from the group consisting of oxides, carbides and nitrides.

5. The method of claim 1 wherein the printing member further comprises a third layer disposed beneath the second layer.

6. The method of claim 5 wherein the first and third layers have different affinities for at least one printing liquid selected from the group consisting of ink and an abhesive fluid for ink, the removing step further comprising removing the second layer as well as the first layer where the first layer is detached from the second layer.

7. The method of claim 1 wherein the second layer is an oleophilic polymer comprising means for absorbing imaging radiation.

8. The method of claim 7 wherein the polymer is a conductive polycarbonate.

9. The method of claim 1 wherein the heating step comprises:

a. spacing at least one laser source that produces an imaging output opposite the printing member;

b. guiding the output of the at least one laser source to focus on the printing member;

c. causing relative movement between the laser output and the printing member to effect a scan of the printing member by the laser output; and d. imagewise exposing the printing member to the laser output during the course of the scan.

10. The method of claim 9 wherein the laser emits infrared radiation.

11. The method of claim 9 wherein the first layer is substantially transparent to the imaging output.

12. The method of claim 1 wherein the first layer is oleophobic and the second layer accepts ink.

13. The method of claim 12 wherein the first layer comprises silicone.

14. The method of claim 1 wherein the first layer is hydrophilic and the second layer is hydrophobic and oleophilic.

15. The method of claim 1 wherein the first layer comprises a heat-responsive polymer which, when subjected to heating, becomes chemically modified to resist reattachment.

16. The method of claim 15 wherein the first layer comprises a heat-responsive polymer that undergoes rapid thermal homolysis.

17. The method of claim 16 wherein the first layer is a block copolymer comprising a polysiloxane chemical species and an acrylic chemical species.

18. A method of imaging a lithographic printing member, the method comprising the steps of:

a. providing a printing member including a first layer, a second layer disposed beneath and attached to the first layer and a third layer disposed beneath the second layer, the first layer and at least one of the other layers having different affinities for at least one printing liquid selected from the group consisting of ink and an abhesive fluid for ink;

b. heating the printing member so as to irreversibly detach, in an imagewise pattern, the first layer from the second layer without ablating the second layer; and c. removing at least the first layer where detached from the second layer so as to form a lithographic image comprising regions having said different affinities.

19. The method of claim 18 wherein the removing step further comprises removing the second layer as well as the first layer where the first layer is detached from the second layer.

20. The method of claim 18 wherein the second layer is metal.

21. The method of claim 20 wherein the metal layer does not undergo phase change as a consequence of heating.

22. The method of claim 20 wherein the metal layer comprises at least one of titanium, aluminum, vanadium and zirconium.

23. The method of claim 18 wherein the second layer is polymeric.

24. The method of claim 18 wherein the heating step comprises:

a. spacing at least one laser source that produces an imaging output opposite the printing member;

b. guiding the output of the at least one laser source to focus on the printing member;

c. causing relative movement between the laser output and the printing member to effect a scan of the printing member by the laser output; and d. imagewise exposing the printing member to the laser output during the course of the scan.

25. The method of claim 24 wherein the laser emits infrared radiation.

26. The method of claim 24 wherein the first layer is substantially transparent to the imaging output.

27. The method of claim 18 wherein the first layer is oleophobic and the third layer is oleophilic.

28. The method of claim 27 wherein the first layer comprises silicone.

29. The method of claim 28 wherein the metal layer is titanium.

30. The method of claim 18 wherein the second layer is at least partially unremoved where the first layer is detached from the second layer, the first layer being oleophobic and the second layer accepting ink.

31. The method of claim 18 wherein the first layer is hydrophilic and the third layer is hydrophobic and oleophilic.

32. The method of claim 18 wherein the first layer comprises a heat-responsive polymer which, when subjected to heating, becomes chemically modified to resist reattachment.

33. The method of claim 32 wherein the first layer comprises a heat-responsive polymer that undergoes rapid thermal homolysis.

34. The method of claim 33 wherein the first layer is a block copolymer comprising a polysiloxane chemical species and an acrylic chemical species.

35. The method of claim 33 wherein the printing member further comprises an intermediate layer between the first and second layers, and irreversible detachment is achieved by detaching the second layer from the intermediate layer.

* * * * *